(12) United States Patent
Monfray et al.

(10) Patent No.: US 9,615,443 B2
(45) Date of Patent: Apr. 4, 2017

(54) INTEGRATED CIRCUIT CHIP COOLING DEVICE

(71) Applicants: STMicroelectronics (Crolles 2) SAS, Crolles (FR); STMicroelectronics SA, Montrouge (FR); Commissariat A L'Energie Atomique et aux Energies Alternatives, Paris (FR)

(72) Inventors: Stephane Monfray, Eybens (FR); Sandrine Lhostis, Theys (FR); Christophe Maitre, Barraux (FR); Olga Kokshagina, Paris (FR); Philippe Coronel, Barraux (FR)

(73) Assignees: STMicroelectronics (Crolles 2) SAS, Crolles (FR); STMicroelectronics SA, Montrouge (FR); Commissariat A L'Energie Atomique et aux Energies Alternatives, Paris (FR)

( * ) Notice: Subject to any disclaimer, the term of this patent is extended or adjusted under 35 U.S.C. 154(b) by 277 days.

(21) Appl. No.: 14/487,758

(22) Filed: Sep. 16, 2014

(65) Prior Publication Data

US 2015/0075749 A1 Mar. 19, 2015

(30) Foreign Application Priority Data

Sep. 17, 2013 (FR) ...................................... 13 58934

(51) Int. Cl.
*F28F 27/00* (2006.01)
*H05K 1/02* (2006.01)
(Continued)

(52) U.S. Cl.
CPC ......... *H05K 1/0203* (2013.01); *F28D 9/0062* (2013.01); *F28F 27/02* (2013.01); *H01L 23/473* (2013.01); *H01L 2924/0002* (2013.01)

(58) Field of Classification Search
CPC .. H05K 1/0203; H05K 7/2039; F28D 9/0062; F28F 27/02; H01L 23/473; H01L 2924/0002; H01L 25/167
(Continued)

(56) References Cited

U.S. PATENT DOCUMENTS 7,763,973 B1 7/2010 Bratkovski et al.
2001/0048698 A1* 12/2001 Lorenzen ................ H01S 5/024
372/36

(Continued)

FOREIGN PATENT DOCUMENTS

JP 2004295718 A 10/2004

OTHER PUBLICATIONS

INPI Search Report and Written Opinion for FR 1358934 dated Jun. 24, 2014 (7 pages).

*Primary Examiner* — Davis Hwu
(74) *Attorney, Agent, or Firm* — Gardere Wynne Sewell LLP

(57) ABSTRACT

An integrated circuit chip cooling device includes a network of micropipes. A first pipe portion and a second pipe portion of the network are connected by at least one valve. The valve is formed of a bilayer strip. In response to change in temperature, the shape of the bilayer strip changes to move the valve from a substantially closed position to an open position. In one configuration, the change is irreversible. In another configuration, the change is reversible in response to an opposite change in temperature.

22 Claims, 4 Drawing Sheets

(51) Int. Cl.
*F28D 9/00* (2006.01)
*F28F 27/02* (2006.01)
*H01L 23/473* (2006.01)

(58) Field of Classification Search
USPC ........................................ 165/96; 372/36, 34
See application file for complete search history.

(56) References Cited

U.S. PATENT DOCUMENTS

2004/0113265 A1 6/2004 DiBattista et al.
2006/0227512 A1 10/2006 Dishongh et al.

\* cited by examiner

INTEGRATED CIRCUIT CHIP COOLING DEVICE

PRIORITY CLAIM

This application claims the priority benefit of French Patent application number 1358934, filed on Sep. 17, 2013, the contents of which is hereby incorporated by reference in its entirety to the maximum extent allowable by law.

TECHNICAL FIELD

The present disclosure relates to an integrated circuit chip cooling device.

BACKGROUND

The article "3-D Packaging With Through-Silicon Via (TSV) for Electrical and Fluidic Interconnections" by Navas Khan, et al. (incorporated herein by reference), teaches an integrated circuit chip cooling device comprising a network of micropipes having a liquid, circulated by a pump, flowing therethrough.

Another device of this type is described in article "Hybrid 3D-IC Cooling System Using Micro-Fluidic Cooling and Thermal TSVs" by Bing Shi, et al. (incorporated herein by reference).

A simple, compact, and easy-to-form device, enabling to efficiently cool a varied range of chips, particularly chips comprising areas dissipating, in operation, different amounts of thermal power, is however needed.

SUMMARY

Thus, an embodiment provides an integrated circuit chip cooling device, comprising a network of micropipes, wherein pipe portions are connected by valves, each comprising at least one bilayer strip.

According to an embodiment, in each valve, the strip is adapted to change shape under the effect of a variation of its temperature.

According to an embodiment, in each valve, the strip is adapted to pass from a first shape where the strip delimits in the valve a first opening, when its temperature is lower than a first threshold, to a second shape where the strip delimits in the valve a second opening larger than the first opening, when its temperature reaches the first threshold.

According to an embodiment, in each valve, the strip is further adapted to return from its second shape to its first shape when its temperature falls back below a second threshold lower than the first threshold.

According to an embodiment, in each valve, the passing of the strip from its first shape to its second shape is irreversible.

According to an embodiment, in each valve, the strip comprises two stacked layers of different materials having different thermal expansion coefficients.

According to an embodiment, the material of each of the layers is selected from among titanium nitride, titanium, aluminum, copper, iron, gold, tungsten, platinum, an iron-nickel alloy, silicon oxide, or an alloy of any of these materials.

According to an embodiment, in each valve, the strip has the shape of a disk portion.

According to an embodiment, the micropipe network comprises a first network of interconnected trenches located in a first substrate, and a second network of interconnected trenches located in a second substrate stacked to the first substrate and separated from the first substrate by a stack of two layers of different materials having different thermal expansion coefficients.

According to an embodiment, the micropipe network further comprises first and second holes crossing the second substrate and connecting the second trench network to the first trench network.

According to an embodiment, the first holes directly connect the second trench network to the first trench network.

According to an embodiment, each second hole connects the second trench network to the first trench network via one of the valves, the strips being formed in said stack.

According to an embodiment, the holes have a flared shape.

According to an embodiment, the strips are bistable.

According to an embodiment, the strips are progressively deformable.

BRIEF DESCRIPTION OF THE DRAWINGS

The foregoing and other features and advantages will be discussed in detail in the following non-limiting description of specific embodiments in connection with the accompanying drawings wherein:

FIGS. 3A, 3B1 and 3B2 show in further detail an embodiment of a valve of a cooling device of the type described in relation with FIGS. 2A to 2D;

DETAILED DESCRIPTION OF THE DRAWINGS

Figure 1A:
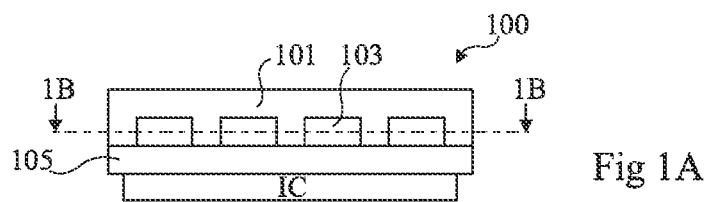
FIGS. 1A and 1B are cross-section views illustrating an example of integrated circuit chip cooling device.

For clarity, the same elements have been designated with the same reference numerals in the various drawings and, further, the various drawings are not to scale. Further, in the following description, unless otherwise indicated, terms "approximately", "substantially", "around", and "in the order of" mean "to within 10%", and terms referring to directions, such as topping, above, under, upper, lower, vertical, horizontal, lateral, etc. apply to devices arranged as illustrated in the lateral cross-section views of the corresponding drawings, it being understood that, in operation, the devices may have different directions.

Figure 1B:
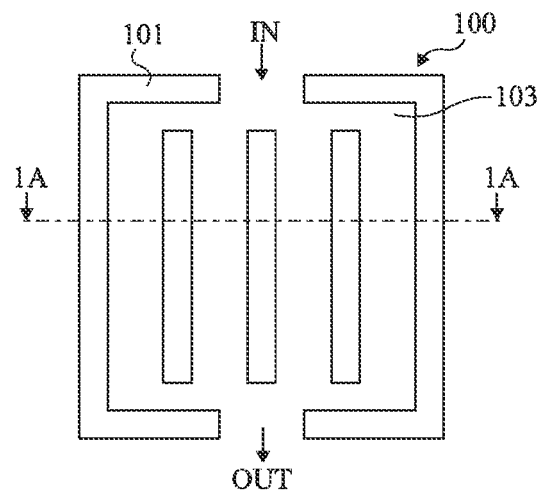

FIGS. 1A and 1B are cross-section views illustrating an example of a device 100 for cooling an integrated circuit chip IC. FIG. 1A is a lateral cross-section view of device 100 and of chip IC along cross-section plane 1A-1A of FIG. 1B, and FIG. 1B is a top cross-section view of device 100 along cross-section plane 1B-1B of FIG. 1A.

Device 100 comprises a substrate 101, for example, made of silicon, of silicon oxide, or of aluminum nitride. Substrate 101 for example has a thickness in the range from a few micrometers to a few millimeters. On its lower surface side, substrate 101 comprises a network of interconnected trenches 103 regularly distributed across the substrate surface. Trenches 103 extend in substrate 101 down to a depth smaller than the substrate thickness. As an example, trenches 103 have a depth in the range from 1 to 500 µm, and longitudinally extend over distances in the range from 1 to 100 mm. On the lower surface side of substrate 101, device 100 further comprises a cap 105, for example, an approximately planar plate placed against the lower surface of substrate 101, which tightly closes each of trenches 103 on its lower surface side. Cap 105 is for example made of silicon, of metal (for example, copper), of glass, or of plastic (for example of PMMA—poly(methyl methacrylate)). The thickness of cap 105 may be in the range from a few micrometers to a few millimeters. The walls of trenches 103 and cap 105 define a network of interconnected micropipes through which a cooling liquid can flow. In this example, the network of micropipes of device 100 comprises an inlet opening IN through which cooling liquid can enter the network, and an outlet opening OUT through which cooling liquid can come out of the network. Device 100 may comprise a pump, not shown, to circulate the cooling liquid from inlet IN to outlet OUT of the micropipe network. In the shown example, a chip IC (FIG. 1A) to be cooled is arranged against the lower surface of cap 105.

In this example, the amount of thermal power which can be carried off by device 100 is substantially the same at all points of the surface to be cooled. However, in practice, two distinct regions of a same integrated circuit chip may, in operation, dissipate different amounts of thermal power. In this case, the cooling provided by device 100 is not optimal. Indeed, when cooling device 100 is sized to enable to sufficiently cool the hottest areas of the chip, the coldest areas of the chip are cooled more than necessary. This particularly results in an unnecessary electric power consumption of the pump circulating the cooling liquid in the device.

To improve the cooling efficiency when the chip to be cooled comprises areas dissipating different amounts of thermal power, the distribution of the micropipes facing the surface to be cooled could be modified. A density of micropipes facing the hottest areas of the chip greater than the density of micropipes facing the coldest areas of the chip could for example be provided.

However, such a solution requires knowing in advance, on design of the cooling device, the thermal behavior of the chip, and particularly the position of the hot spots of the chip. The cooling device is then specific to a particular chip type, which is not economical. Further, such a cooling device loses its efficiency if hot spots of the chip move during the operation, which may occur in certain types of chips.

Figure 2A:
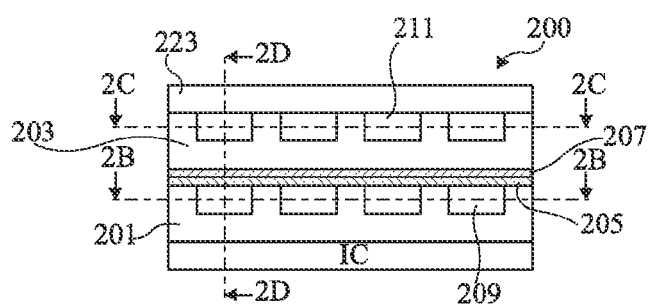
FIGS. 2A to 2D are cross-section views illustrating an embodiment of an integrated circuit chip cooling device.
Figure 2B:
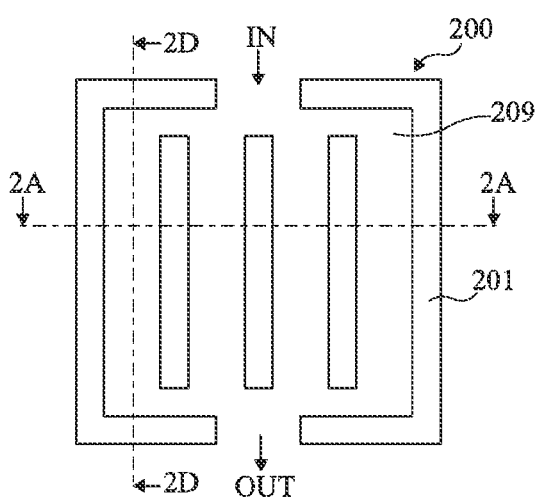
Figure 2C:
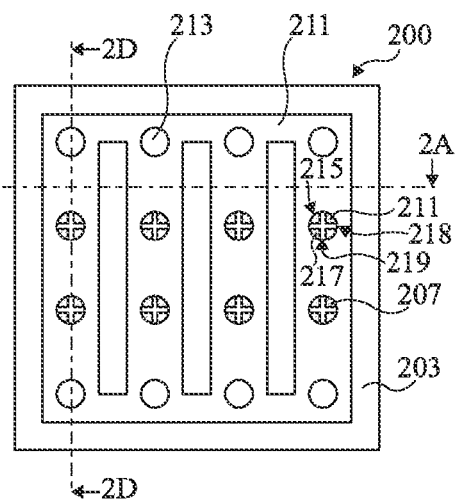
Figure 2D:
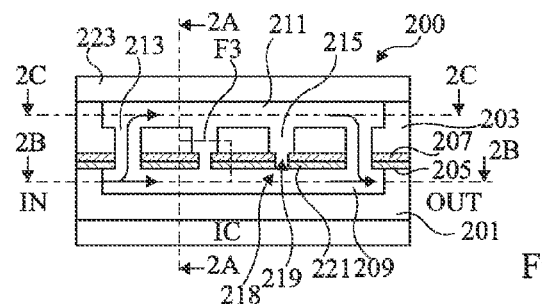

FIGS. 2A to 2D are cross-section views illustrating an embodiment of a device 200 for cooling an integrated circuit chip IC. FIG. 2A is a lateral cross-section view of device 200 and of chip IC along cross-section plane 2A-2A of FIGS. 2B, 2C, and 2D, FIG. 2B is a top cross-section view of device 200 along cross-section plane 2B-2B of FIGS. 2A and 2D, FIG. 2C is a top cross-section view of device 200 along cross-section plane 2C-2C of FIGS. 2A and 2D, and FIG. 2D is a lateral cross-section view of device 200 and of chip IC along cross-section plane 2D-2D of FIGS. 2A, 2B, and 2C.

Device 200 comprises, in this example, two stacked substrates 201 and 203, separated by a stack of two layers 205, 207 of different materials, for example, metals, having different thermal expansion coefficients. The material of each of layers 205, 207 is for example selected from among titanium nitride, titanium, aluminum, copper, iron, gold, tungsten, platinum, an iron-nickel alloy, silicon oxide, or an alloy of any of these materials. Each of the two layers 205, 207 for example has a thickness in the range from 0.1 to 10 μm. Substrates 201 and 203 are for example made of silicon or of silicon oxide, but the described embodiments are not limited to these specific examples. More generally, substrates 201 and 203 may be made of any semiconductor, conductive, or insulating material where trenches can be formed. In the shown example, substrate 203 is located above substrate 201.

On the side of its surface facing layers 205, 207, that is, on its upper surface side in the orientation of FIGS. 2A and 2D, substrate 201 comprises a network of interconnected trenches 209, for example, regularly distributed across the substrate surface. Trenches 209 extend in substrate 201, from its upper surface, down to a depth smaller than the total thickness of substrate 201.

On the side of its surface opposite to layers 205, 207, that is, on its upper surface side in the orientation of FIGS. 2A and 2D, substrate 203 comprises a network of interconnected trenches 211, for example, regularly distributed across the substrate surface. Trenches 211 extend in substrate 203, from its upper surface, down to a depth smaller than the total thickness of substrate 203.

Trenches 209 and 211 are for example arranged so that at least a portion of trench network 209 faces a portion of trench network 211, that is, is aligned, in vertical projection in the orientation of FIGS. 2A and 2D, with a portion of trench network 211. In the shown example, all the trenches 209 formed in substrate 201 face trenches 211 formed in substrate 203, and conversely. The described embodiments are however not limited to this specific case.

In device 200, holes extend in substrate 203 from the bottom of trenches 211, thoroughly crossing the lower portion of substrate 203, and emerging on the side of substrate 203 facing layers 205, 207, in front of trenches 209. Some of these holes, referred to as 213 in FIGS. 2C and 2D, cross the stack of layers 205, 207, and emerge into trench network 209. Other holes, referred to as 215 in FIGS. 2C and 2D, emerge onto the stack of layers 205, 207, but do not cross layers 205 and 207. Holes 213, 215 for example extend approximately vertically in substrate 203.

At the bottom of each hole 215, portion 217 of the stack of layers 205, 207 located in front of the hole comprises at least one through opening 219 in the shape of a relatively narrow slot, for example, having a width in the range from 20 nm to 1 μm, delimiting in portion 217 at least one bilayer strip 221, for example, a bimetal strip. In this example, as will be explained in further detail hereafter in relation with FIGS. 3A and 3B, each strip 221 is initially substantially planar at ambient temperature, and is capable of deforming by curving when its temperature exceeds a threshold T1 greater than the ambient temperature, due to the thermal expansion coefficient difference which exists between layer 205 and layer 207.

On the side of the surface of substrate 203 opposite to layers 205, 207, that is, on the upper surface side of substrate 203 in the orientation of FIGS. 2A and 2D, device 200 further comprises a cap 223, for example, an approximately planar plate arranged against the upper surface of substrate 203, which tightly closes each of trenches 211 on its upper surface side. Cap 223 may be a substrate made of silicon, glass, metal, plastic, or any other insulating, semiconductor, or conductive material capable of tightly closing the trenches. As an example, the material of cap 223 is made of polymer, for example, polyethylene, PVC, etc.

The walls of trenches 209 and 211, the walls of through holes 213 and 215, and cap 223, define a network of interconnection micropipes capable of conveying a cooling fluid in liquid or gas form, for example, water, an alcohol such as isopropyl alcohol, a liquid metal such as gallium, a specific liquid such as the liquid commercialized by company 3M under trade name "Novec 7500 Engineered Fluid". More generally, other types of cooling fluid may be envisaged, for example, a mixture of liquids which can be miscible or not, a fluid at equilibrium between its liquid, gas, and/or solid (gel) phases, capable of discharging the heat by phase change (operation of heat pipe type), etc. As an example, the micropipes have, in transverse cross-section, dimensions in the range from 1 to 1,000 µm. Thus, in device 200, through holes 213, 215 are for example cylindrical holes having an approximately circular cross-section, with a diameter in the range from 1 to 1,000 µm, and trenches 209, 211 for example have an approximately square or rectangular cross-section with a side length between 1 and 1,000 µm.

In this example, the network of micropipes of device 200 comprises an inlet opening IN through which cooling fluid can enter the network, and an outlet opening OUT through which cooling fluid can come out of the network. Device 200 may comprise a pump, not shown, to circulate the cooling fluid from inlet IN to outlet OUT of the micropipe network. In the shown example, chip IC (FIGS. 2A and 2D) to be cooled is arranged against the lower surface of substrate 201.

In device 200, each portion 217 of the stack of layers 205, 207 located in front of a hole 215 defines a valve 218 connecting two pipe portions of the network. The opening of each valve 218 depends on the shape of the strip(s) 221 comprised therein. Each valve 218 may have at least two states: a first state, which will here be called the closed state, where strip(s) 221 of the valve have shapes such that they almost totally close the opening between the two pipe portions connected by the valve, thus only allowing a negligible amount of fluid or no fluid at all to pass through the valve; and a second state, which will be here called open state, where strip(s) 221 of the valve have shapes such that they delimit an opening capable of letting a non-negligible amount of fluid flow through the valve. Valves 218 may be regularly distributed in the micropipe network of the device.

Figure 3A:
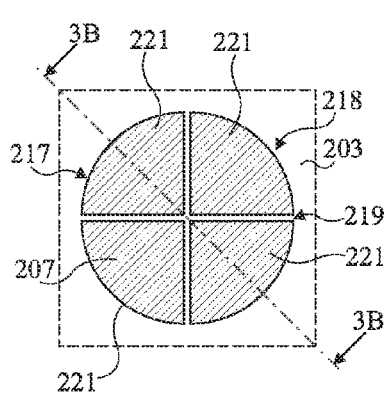

FIGS. 3A, 3B1 and 3B2 show in further detail an embodiment of a valve 218 of cooling device 200 of FIGS. 2A to 2D. More particularly, FIGS. 3A, 3B1 and 3B2 are enlarged views of a portion F3 of device 200 shown in dotted lines in FIG. 2D and comprising a valve 218. FIG. 3A is a top view of valve 218 in the closed state and FIGS. 3B1 and 3B2 comprise two cross-section views of valve 218 along cross-section plane 3B-3B of FIG. 3A, showing valve 218 respectively in the closed state and in the open state.

In the closed state (FIG. 3B1), valve 218 comprises, in this example, four approximately planar strips 221. Each strip 221 approximately corresponds to one quarter of the disk formed by portion 217 of stack 205, 207 located at the bottom of hole 215 containing the valve. The four strips 221 are delimited in stack portion 217 by a through opening 219 in the form of a cross-shaped slot having its center substantially coinciding with the center of stack portion 217.

Under the effect of a heating, due to the thermal expansion coefficient difference between the materials of layers 205 and 207, strips 221 are capable of taking a curved shape, such as shown in FIG. 3B2, defining through valve 218 a greater opening than opening 219 separating strips 221 in the closed state. Valve 218 is then in the open state. In the shown example, when valve 218 is in the open state, each strip 221 has a curved shape such that its free end, that is, the tip of the strip directed towards the valve center, is located above the fixed portion of the strip, that is, the rounded edge of the quarter disk of the strip by which the strip is connected to the rest of stack 205, 207. The free end of each strip 221 is then more distant from the center of valve 218 than in the closed state. In other words, in this example, when valve 218 passes from the closed state to the open state, strips 221 open up like flower petals.

Cooling device 200 operates as follows.

In an initial state where chip IC to be cooled is not powered and emits no or little thermal power, all valves 218 of the device are for example in the closed state. Cooling fluid may flow between inlet IN and outlet OUT of the micropipe network, through the pipes defined by trenches 209 and 211 and through holes 213. However, the fluid does not or only slightly crosses valves 218, and thus does not or only slightly flows through the pipes defined by holes 215.

When chip IC is operating, it emits thermal power, which is partially discharged by the cooling fluid. The thermal power emitted by the chip heats up valves 218 of device 200. The amount of thermal power emitted by the chip may be greater in certain chip areas than in others. Thus, the different valves 218 of the device may have different temperatures.

When the temperature of a valve 218 reaches threshold T1, this valve switches to the open state. Cooling fluid can then flow through the pipe portion defined by hole 215 located above the valve. As a result, a greater amount of cooling fluid heated by the chip can be discharged by the micropipe network in the corresponding area. In other words, the opening of valve 218 locally increases the cooling capacity of device 200 with respect to the areas of the device where valves 218 are in the closed state.

Strips 221 of valves 218 are for example formed so that valve opening threshold T1 is such that, in steady state in normal operating conditions, valves 218 located above hot areas of the chip are in the open state, and valves 218 located above colder areas of the chip are in the closed state (in the case of a chip comprising areas dissipating different amounts of thermal power). As an example, threshold T1 may be between 70 and 90° C.

In a first embodiment, the deformation of strips 221 is reversible, that is, when the temperature of a valve 218 in the open state drops below a threshold T2 lower than threshold T1, this valve returns to the closed state. This first embodiment is particularly advantageous when the hot spots of the chip are likely to move during the chip operation. Indeed, in this case, the local cooling capacity of the different areas of device 200 can automatically adjust according to the motions of the hot chip areas. Threshold T2 is for example in the range from 30 to 70° C. In this first embodiment, layers 205 and 207 are for example respectively made of titanium and gold, of aluminum and silicon oxide, of titanium and aluminum, of tungsten and aluminum, or of tungsten and gold.

In a second embodiment, the deformation of strips 221 is irreversible, that is, once a valve 218 has been opened, it does not close when its temperature decreases. This embodiment is particularly adapted to the cooling of chips where the hot spots do not move during the chip operation. In this second embodiment, the cooling device micropipe network may be automatically configured on first use of the chip, but is not reconfigured each time the chip stops/restarts. An advantage is that each strip 221 of the device is actuated at most once, which limits risks of mechanical wear. In this second embodiment, layers 205 and 207 are for example made of titanium and copper, of tungsten and copper, or of silicon oxide and copper.

Bilayer strips 221 may be bistable, that is, they rapidly switch from the closed state to the open state when they are heated up to threshold T1 and, possibly, rapidly switch from the open state to the closed state when they are cooled down to threshold T2 (in the first embodiment).

As a variation, the deformations of strips 221 may be progressive. In this case, each valve 218 may take a plurality of intermediate states between the closed state and the open state, according to the temperature of strips 221.

Figure 4:
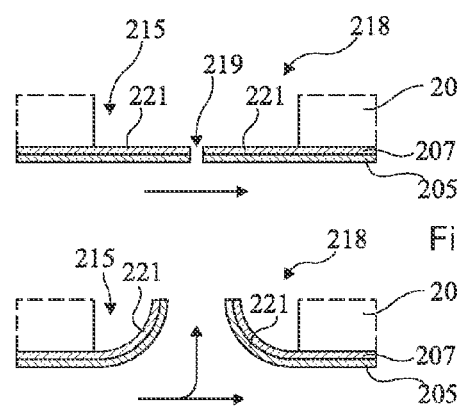
FIG. 4 is a cross-section view illustrating an alternative embodiment of an integrated circuit chip cooling device.
Figure 4:
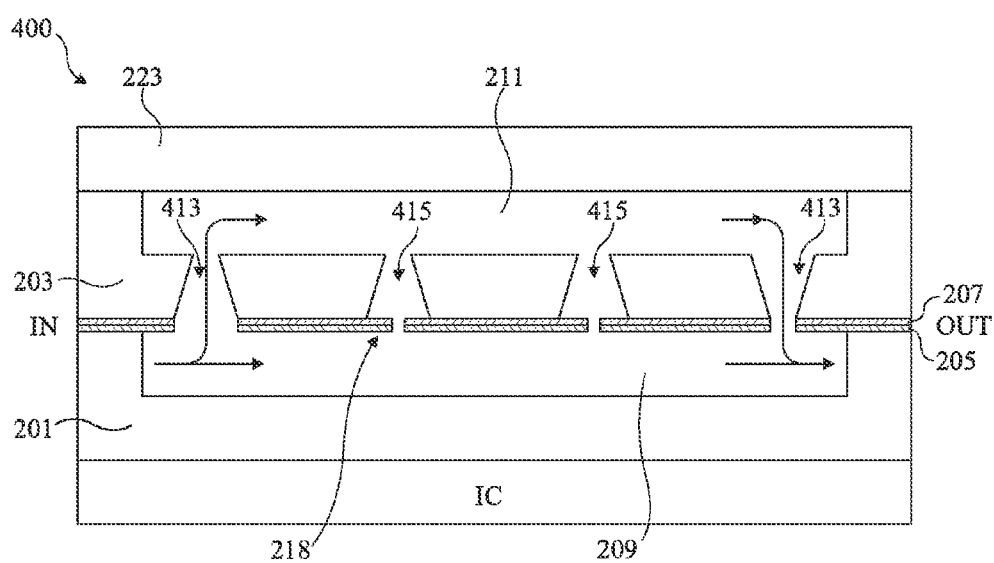

FIG. 4 is a lateral cross-section view, in a cross-section plane similar to the cross-section plane of FIG. 2D, illustrating an alternative embodiment of an integrated circuit chip cooling device.

Device 400 of FIG. 4 comprises many elements common with device 200 of FIGS. 2A to 2D. Hereafter, only the differences between the two devices will be highlighted.

The main difference between device 400 and device 200 is that, where device 200 comprises through holes 213 and 215 in the form of rectilinear cylinders having an approximately constant cross-section along their entire height, device 400 comprises through holes 413 and 415 of different shapes. In the shown example, holes 413 cross the stack of layers 205, 207, directly connecting portions of trenches 211 to portions of trenches 209, and holes 415 emerge onto the stack of layers 205, 207 without crossing it. Valves 218 located at the bottom of holes 415 connect portions of trenches 211 to portions of trenches 209.

In the alternative embodiment of FIG. 4, holes 413, 415 have a shape capable of promoting the flowing of the cooling fluid in one direction rather than in the other. In the shown example, holes 413, 415 have a flared shape, for example, a tapered shape with circular cross-section. In this example, inlet IN and outlet OUT of device 400 are located in the lower portion of the micropipe network, that is, in the level of trenches 209. In the vicinity of its inlet IN, device 400 comprises, in this example, one or a plurality of flared holes 413 having their largest cross-section on the side of trenches 209 and their smallest cross-section on the side of trenches 211. These holes promote the flowing of the cooling fluid from trench network 209 to trench network 211 in the vicinity of the device inlet. In the vicinity of its outlet OUT, device 400 comprises, in this example, one or several flared holes 413 having their largest cross-section on the side of trenches 211 and their smallest cross-section on the side of trenches 209. Such holes promote the flowing of the cooling fluid from trench network 211 to trench network 209 in the vicinity of the device outlet. The provision of the above-mentioned flared holes 413 eases the distribution of the cooling fluid throughout the entire micropipe network and its flowing from inlet IN to outlet OUT of the device. Further, in this example, holes 415 are flared holes having their largest cross-section on the side of trenches 209 and their smallest cross-section on the side of trenches 211. Holes 415 promote the flowing of the cooling fluid from trench network 209 to trench network 211 when the corresponding valves 218 are in the open state. As a variation, some of holes 415 or all holes 415 may have their largest cross-section on the side of trenches 211 and their smallest cross-section on the side of trenches 209 according to the path which is desired to be followed by the cooling fluid. It should be noted that the described embodiments are not limited to the above-mentioned shapes of holes 413, 415. More generally, it will be within the abilities of those skilled in the art to provide other shapes providing the desired effect. Further, a coating, not shown, capable of easing the flowing of the cooling fluid, may optionally coat the walls of trenches or of holes of the micropipe network.

FIGS. 5A to 5G are lateral cross-section views schematically illustrating steps of an example of a method of manufacturing a cooling device of the type described in relation with FIGS. 2A to 2D and 3A, 3B. FIGS. 5A, 5B, 5C and 5D are views in a cross-section plane similar or identical to that of FIG. 2A, and FIGS. 5E, 5F, and 5G are views in a cross-section plane similar or identical to that of FIG. 2D.

Figure 5A:
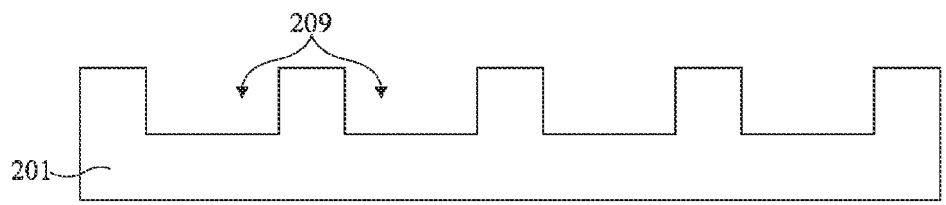
FIGS. 5A to 5G are cross-section views illustrating an example of a method of manufacturing an integrated circuit chip cooling device.

FIG. 5A illustrates a step of forming trench network 209 on a surface of substrate 201. Trenches 209 are for example formed by etching, or by any other adapted method. A mask, not shown, may be used to delimit the regions of substrate 201 to be etched.

Figure 5B:
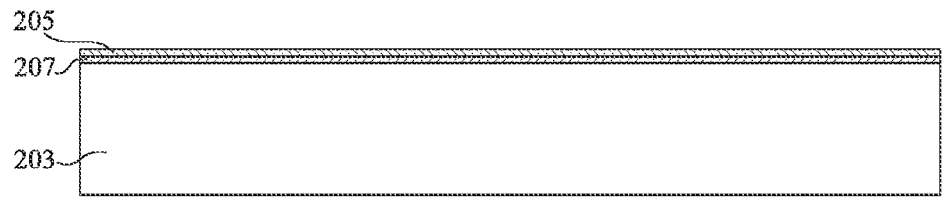

FIG. 5B illustrates a step of forming, on a surface of a second substrate 203, stacked layers 205 and 207. In the shown example, layer 207 covers a surface of substrate 203 and layer 205 covers the surface of layer 207 opposite to substrate 203. Layers 207 and 205 are for example successively formed by vapor deposition, or by any other adapted method.

Figure 5C:
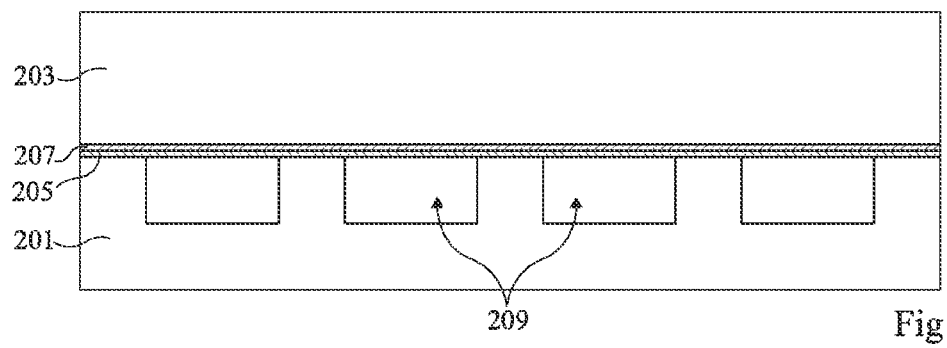

FIG. 5C illustrates a step during which substrate 203 is placed on substrate 201 so that the surface of substrate 201 on the side of trenches 209 is arranged against the external surface of layer 205.

Figure 5D:
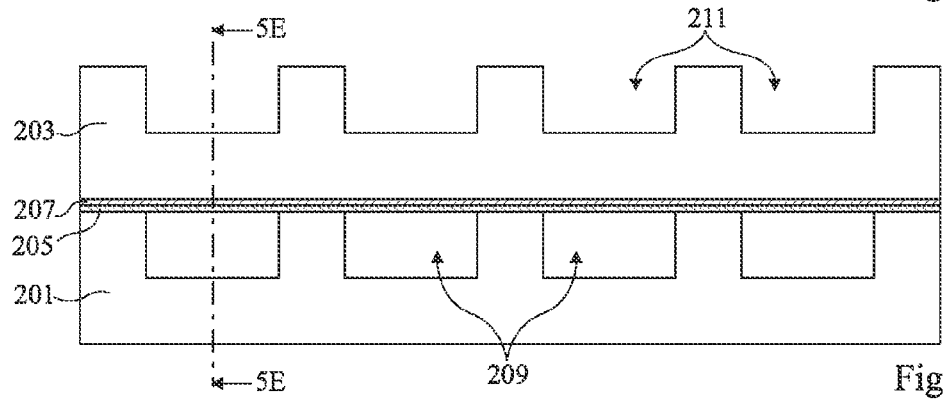

FIG. 5D illustrates a step of forming trench network 211 on the side of the surface of substrate 203 opposite to layers 205, 207. Trenches 211 are for example formed by etching, or by any other adapted method. A mask, not shown, may be used to delimit the regions of substrate 203 to be etched.

Figure 5E:
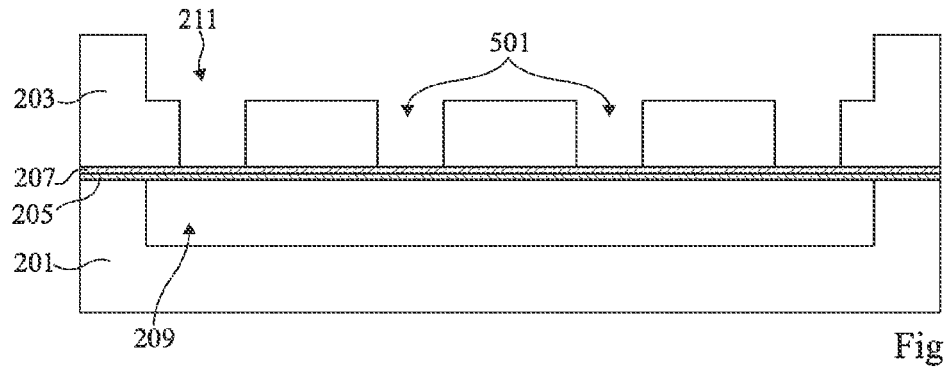

FIG. 5E illustrates a step of forming a plurality of holes 501, for example, regularly distributed across the entire surface of substrate 203, these holes extending from the bottom of trenches 211, crossing the lower portion of substrate 203, and emerging onto layer 207 without crossing it. Holes 501 are for example formed by etching or by any other adapted method. Masks, not shown, may be used to delimit the regions of substrate 203 to be etched. It will be noted that FIG. 5E is a cross-section taken along lines 5E-5E of FIG. 5D.

Figure 5F:
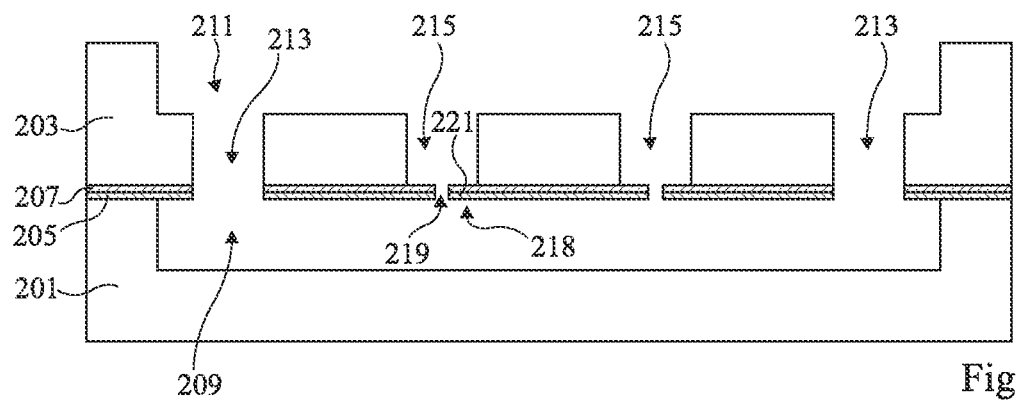

FIG. 5F illustrates a step during which some of holes 501 are continued through the stack of layers 205, 207 to totally remove the portion of stack 205, 207 located at the bottom of these holes and to form holes 213 of device 200 (FIGS. 2C and 2D). FIG. 5F further illustrates a step during which, at the bottom of other holes 501, corresponding to holes 215 of device 200, through openings 219 are formed in the stack of layers 205, 207 to delimit bimetal strips 221 of valves 218. The steps of total opening of holes 213 and of forming through openings 219 at the bottom of holes 215 may be carried out simultaneously or successively. The openings in stack 205, 207 may for example be formed by etching. A conformal or non-conformal mask, not shown, may be formed at the surface of the device to delimit the areas of stack 205, 207 to be removed on etching. As a variation, the openings in stack 205, 207 may be formed without using a mask, for example, by laser etching.

Figure 5G:
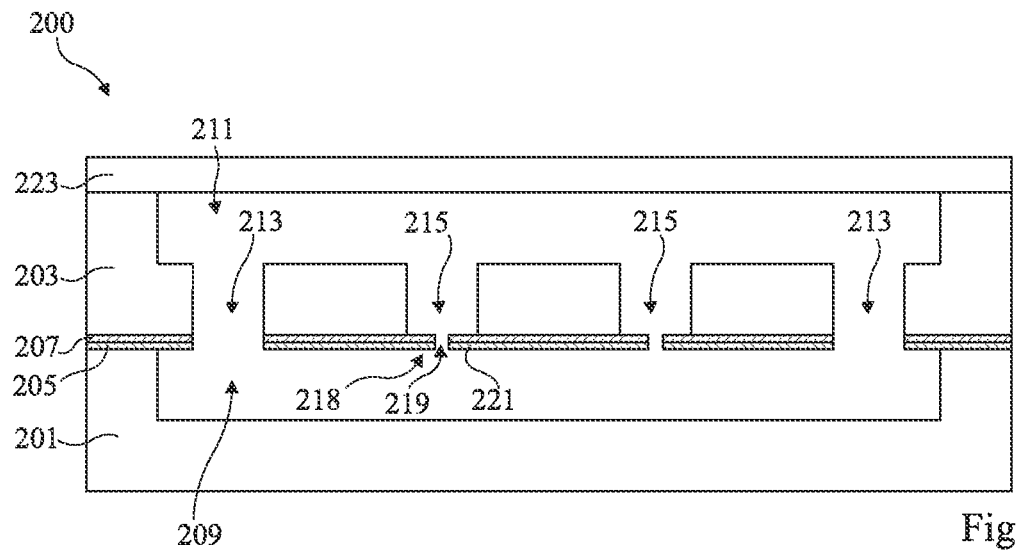

FIG. 5G illustrates a step of placing cap 223 on the upper surface side of substrate 203. Cap 223 is for example glued to the upper surface of substrate 223, for example, by means of a polymer glue such as a glue containing benzocyclobutene (BCB).

FIGS. 5F and 5G are also cross-sections taken along line 5E-5E of FIG. 5D.

An advantage of the described embodiments is that they enable, as compared with existing cooling devices, to improve the cooling efficiency while remaining compatible with varied ranges of chips since, in the described embodiments, the micropipe network of the cooling device is automatically configured according to the thermal behavior of the chip.

Specific embodiments have been described. Various alterations, modifications, and improvements will readily occur to those skilled in the art.

In particular, the described embodiments are not limited to the specific example of shape and arrangement of bilayer strips 221 of valves 218 described in relation with FIGS. 3A and 3B. More generally, it will be within the abilities of those skilled in the art to obtain the desired behavior by using bilayer strips having other shapes than those described hereabove and/or arranged differently. As an example, the bilayer strips may be rectangular, triangular, in the shape of disk portions of an angle smaller or greater than 45 degrees, etc. Further, each valve 218 may comprise a number of strips different than 4.

Further, the described embodiments are not limited to the above-mentioned example of arrangement of the micropipe network. The described embodiments are compatible with other arrangements of the micropipe network, for example, an arrangement comprising a number of trench levels greater or smaller than two, since the network comprises valves with bilayer strips which are capable of locally modifying the cooling capacity of the device when they open. As an example, the micropipe network may comprise more than one inlet and more than one outlet. Further, based on the above-discussed operating principles, a cooling device where micropipes conveying a cooling fluid are provided on both sides of the chip to be cooled may be provided.

Further, as a variation, the electronic components to be cooled are not necessarily located in a chip separate from the cooling device, but may be formed in substrate 201 or in cap 223 of the cooling device.

Further, the described embodiments are not limited to the above-mentioned examples of dimensions and materials.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for cooling an integrated circuit chip, comprising:
    a network of micropipes including pipe portions;
    wherein said pipe portions are connected by valves, each valve comprising at least one bilayer strip, wherein said at least one bilayer strip is configured to pass from a first shape where the at least one bilayer strip delimits in the valve a first opening when valve temperature is lower than a first threshold to a second shape where the at least one bilayer strip delimits in the valve a second opening larger than the first opening when valve temperature reaches the first threshold; and
    wherein said micropipe network comprises:
        a first network of interconnected trenches located in a first substrate, and
        a second network of interconnected trenches located in a second substrate stacked to the first substrate and separated from the first substrate by a stack of two layers of different materials having different thermal expansion coefficients.

2. The device of claim 1, wherein in each valve said at least one bilayer strip is configured to change shape under the effect of a variation of temperature.

3. The device of claim 1, wherein said at least one bilayer strip in each valve is further configured to return from said second shape to said first shape when valve temperature falls back below a second threshold lower than the first threshold.

4. The device of claim 1, wherein the passing of said at least one strip from said first shape to said second shape is irreversible.

5. The device of claim 1, wherein said at least one bilayer strip in each valve comprises two stacked layers of different materials having different thermal expansion coefficients.

6. The device of claim 5, wherein the material of each of said stacked layers is selected from the group consisting of: titanium nitride, titanium, aluminum, copper, iron, gold, tungsten, platinum, an iron-nickel alloy, silicon oxide, or an alloy of any of these materials.

7. The device of claim 1, wherein said at least one bilayer strip in each valve has the shape of a disk portion.

8. The device of claim 1, wherein said micropipe network further comprises first and second holes crossing the second substrate and connecting the second trench network to the first trench network.

9. The device of claim 8, wherein the first holes directly connect the second trench network to the first trench network.

10. The device of claim 8, wherein each second hole connects the second trench network to the first trench network via one of said valves, the bilayer strips being formed by said stack of two layers.

11. The device of claim 8, wherein said holes have a flared shape.

12. The device of claim 1, wherein said bilayer strips are bistable.

13. The device of claim 1, wherein said bilayer strips are progressively deformable.

14. An apparatus, comprising:
    a first micropipe pipe portion in a first substrate;
    a second micropipe pipe portion in a second substrate;
    a valve interconnecting the first micropipe portion to said second micropipe portion, said valve comprising a bilayer strip positioned between said first and second substrates and configured to move in response to change in temperature from a first substantially closed position to a second open position.

15. The apparatus of claim 14, wherein the bilayer strip comprises: a stack of two layers of different materials having different thermal expansion coefficients positioned between said first and second substrates.

16. The apparatus of claim 14, wherein said first micropipe pipe portion is formed by a first trench in said first substrate having a top which is closed by said stack of two layers, an wherein said second micropipe pipe portion is formed by a second trench in said second substrate having a top closed by a cap member, and further comprising a via extending from a bottom of said second trench to said stack of two layers positioned between said first and second substrates.

17. The apparatus of claim 16, where said valve is formed by at least one slit extending through said stack of two layers at a bottom of said via.

18. The apparatus of claim 14, wherein said movement of the bilayer strip in response to change in temperature from the first substantially closed position to the second open position is irreversible.

19. A device for cooling an integrated circuit chip, comprising:
    a first substrate;
    a second substrate;
    a first network of interconnected trenches located in the first substrate and defining a first pipe portion;

a second network of interconnected trenches located in a second substrate and defining a second pipe portion;

a stack of two layers of different materials having different thermal expansion coefficient, said stack positioned between the first and second substrates, said two layers defining at least one valve between the first and second pipe portions.

20. The device of claim 19, where in the at least one valve of the stack of two layers is configured to pass from a first shape, where the two layers delimit in the valve a first opening when valve temperature is lower than a first threshold, to a second shape, where the two layers delimit in the at least one valve a second opening larger than the first opening when valve temperature reaches the first threshold.

21. The device of claim 20, wherein the at least one valve is configured to return from the second shape to the first shape when valve temperature falls back below a second threshold lower than the first threshold.

22. The device of claim 19, wherein the stack of two layers of different materials is selected from the group consisting of: titanium nitride, titanium, aluminum, copper, iron, gold, tungsten, platinum, an iron-nickel alloy, silicon oxide, or an alloy of any of these materials.

* * * * *